United States Patent
Ho et al.

(10) Patent No.: US 7,329,364 B2
(45) Date of Patent: Feb. 12, 2008

(54) METHOD FOR MANUFACTURING BONDED WAFER WITH ULTRA-THIN SINGLE CRYSTAL FERROELECTRIC FILM

(75) Inventors: Shih-Shian Ho, Taipei (TW); Hung-Yin Tsai, Hsinchu (TW); Chia-Jen Ting, Taoyuan (TW); Chun-Fa Lan, Hsinchu (TW); Chii-Chang Chen, Pingzhen (TW)

(73) Assignee: Industrial Technology Research Institute, Hsinchu (TW)

( * ) Notice: Subject to any disclaimer, the term of this patent is extended or adjusted under 35 U.S.C. 154(b) by 363 days.

(21) Appl. No.: 10/978,566

(22) Filed: Nov. 2, 2004

(65) Prior Publication Data

US 2006/0090691 A1    May 4, 2006

(30) Foreign Application Priority Data

Aug. 10, 2004   (TW)   ............... 93124137 A

(51) Int. Cl.
    *B44C 1/22*   (2006.01)
(52) U.S. Cl. ............... 216/53; 310/313 A; 219/121.46; 117/89
(58) Field of Classification Search ............... 216/53
    See application file for complete search history.

(56) References Cited

U.S. PATENT DOCUMENTS 5,448,126 A * 9/1995 Eda et al. ............... 310/313 A
5,785,874 A * 7/1998 Eda ............... 216/24
5,967,578 A * 10/1999 Frey ............... 294/64.3
6,521,858 B1 * 2/2003 Barnett ............... 219/121.46

FOREIGN PATENT DOCUMENTS

EP    94120599.9   * 12/1994

OTHER PUBLICATIONS thesaurus.com; Feb. 2006.*
Surface treatments; Common Thin Film Coatings; http://www.efunda.com/processes/surface/thingfilm_coatings.cfm; May 17, 2000.*
Don Mattox; Handbook of Physical Vapor Deposition Processing; Noyes Publications; 1998.*

* cited by examiner

*Primary Examiner*—Nadine G. Norton
*Assistant Examiner*—Patricia A. George
(74) *Attorney, Agent, or Firm*—Troxell Law Office, PLLC

(57) ABSTRACT

A method for manufacturing a bonded wafer with ultra-thin single crystal ferroelectric film is provided, comprising the following steps: providing a single crystal ferroelectric wafer and a carrier wafer while activating the surfaces of the single crystal ferroelectric wafer and the carrier wafer; bonding the activated surface of the single crystal ferroelectric wafer to the activated surface of the carrier wafer; and thinning the single crystal ferroelectric wafer for forming an ultra-thin single crystal ferroelectric film. Wherein, the thinning process in the aforesaid preferred embodiment is the method of polishing, grinding, chemical mechanical polishing, or etching. And the bonding force generated in the bonding process is strong enough to resist the shearing force.

6 Claims, 5 Drawing Sheets

METHOD FOR MANUFACTURING BONDED WAFER WITH ULTRA-THIN SINGLE CRYSTAL FERROELECTRIC FILM

FIELD OF THE INVENTION

The present invention relates to a method for manufacturing bonded wafer with ultra-thin single crystal ferroelectric film, and more particularly, to a method combined with wafer bonding and wafer thinning for manufacturing a bonded wafer with ultra-thin single crystal ferroelectric film.

BACKGROUND OF THE INVENTION

Accompanied with the trend of communication using broader band and higher frequency, the performance of related audio and optical communication devices have to be largely improved. Since the single crystal ferroelectric materials have excellence photoelectric characteristics, they are widely used in the audio and optical communication devices.

The current commercialized single crystal ferroelectric wafer with about 300~500 um in thickness can no longer satisfy the requirements of advanced communication devices. In the recent research reports, a high performance device of which the frequency is 3~4 times faster than that of the present devices can be manufactured using the substrate made of ultra-thin single crystal ferroelectric material. For example, professor Osgood uses the Lithium Niobate single crystal substrate with only several micrometer in thickness to manufacture a photoelectric modulator of which the operating frequency can reach 80 GHz or higher. On the other hand, the operating frequency of the present photoelectric modulator using the conventional substrate can only reach 20 GHz.

Obviously, to satisfy the communication requirement of higher and wider frequency, the most efficient and economical way is to use ultra thin substrates for manufacturing those relating devices.

The conventional wafer process can only manufacture wafers of at least several hundred micrometers in thickness, or else the clipping and loading issues have to be overcome while manufacturing ultra-thin wafers. Moreover, the thin wafers are easily broken during the posterior processes. Please refer to FIG. 1A to FIG. 1D, showing the conventional method for manufacturing an ultra-thin single crystal ferroelectric film disclosed in U.S. Pat. Nos. 6,540,827B1 and 6641662B2. As shown in the figures, ions 101 are implanted into a single crystal ferroelectric wafer 100 to generate a metamorphosis layer 102. Then, the metamorphosis layer 102 is removed by the thermal process and chemical etching process so as to complete an ultra-thin single crystal ferroelectric film 100a.

In summary, the conventional method for manufacturing an ultra-thin single crystal ferroelectric film exists at least the following shortcomings:
1. The conventional method adopts the process of single crystal ion cutting such that the cost of equipments required in the process is increased and thus the competitiveness is decreased.
2. The control conditions of the conventional method are much stricter, that cause the process to be much complicated and has affect on the capability of mass production.
3. The conventional method has no carrier wafer to hold the produced ultra-thin single crystal ferroelectric film such that the single crystal ferroelectric film is easily broken and thus the yield of the process is reduced.

SUMMARY OF THE INVENTION

It is the primary object of the present invention to provide a method for manufacturing for manufacturing a bonded wafer with ultra-thin single crystal ferroelectric film, which combines the technique of wafer bonding and wafer thinning for make the same so as to reduce the cost of equipment required in the manufacturing process and increase the commercial competitiveness of the same.

It is another object of the present invention to provide a method for manufacturing a bonded wafer with ultra-thin single crystal ferroelectric film, which has simpler control conditions so as to simplify the complexity of the process and thus improve the capability of mass production.

Yet, another object of the present invention is to provide a method for manufacturing a bonded wafer with ultra-thin single crystal ferroelectric film, which can prevent the ultra-thin single crystal ferroelectric film from breaking in the process so that the production yield can be increased.

In order to achieve the aforesaid objects, the present invention provides a preferred embodiment of the method for manufacturing a bonded wafer with ultra-thin single crystal ferroelectric film, comprising the steps of:
a) providing a single crystal ferroelectric wafer and a carrier wafer while activating the surfaces of said single crystal ferroelectric wafer and said carrier wafer;
b) bonding the activated surface of said single crystal ferroelectric wafer to the activated surface of said carrier wafer; and
c) thinning said single crystal ferroelectric wafer for forming an ultra-thin single crystal ferroelectric film.

According to another preferred embodiment of the invention, the method for manufacturing a bonded wafer with ultra-thin single crystal ferroelectric film, comprising the steps of:
a) providing a single crystal ferroelectric wafer and a carrier wafer while at least forming one poly-crystal thin film over the surface of said single crystal ferroelectric wafer;
b) bonding said poly-crystal thin film of said single crystal ferroelectric wafer to said carrier wafer; and
c) thinning said single crystal ferroelectric wafer for forming an ultra-thin single crystal ferroelectric film.

According to yet another preferred embodiment of the invention, the method for manufacturing a bonded wafer with ultra-thin single crystal ferroelectric film, comprising the steps of:
a) providing a single crystal ferroelectric wafer, a first carrier wafer, and a second carrier wafer;
b) coating a bonding material over the surface of said single crystal ferroelectric wafer;
c) bonding said single crystal ferroelectric wafer to said first carrier wafer with said bonding material so as to form a sandwich structure as single crystal ferroelectric wafer/bonding material/first carrier wafer;
d) thinning said single crystal ferroelectric wafer for forming a single crystal ferroelectric thin film;
e) bonding said single crystal ferroelectric thin film to the second carrier wafer, and removing said bonding material and said first carrier wafer; and
f) thinning said single crystal ferroelectric thin film for forming an ultra-thin single crystal ferroelectric film.

Wherein, the thinning process in the aforesaid preferred embodiment is accomplished by the method of polishing, grinding, chemical mechanical polishing, or etching, etc. In addition, the bonding force generated in the bonding process is strong enough to resist the shearing force.

DETAILED DESCRIPTION OF THE INVENTION

Matched with corresponding drawings, the preferable embodiments of the invention are presented as following and hope they will benefit your esteemed reviewing committee members in reviewing this patent application favorably.

Figure 1A:
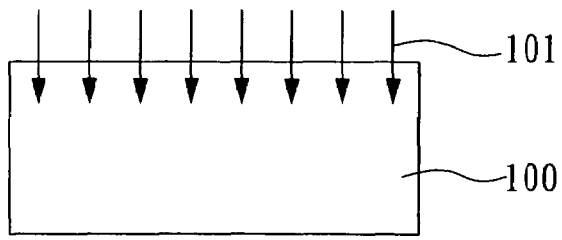
FIG. 1A to FIG. 1D is the schematic view showing a conventional method for manufacturing a bonded wafer with ultra-thin single crystal ferroelectric film.
Figure 1B:
Figure 1B:
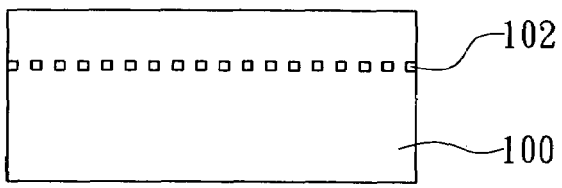
Figure 1C:
Figure 1C:
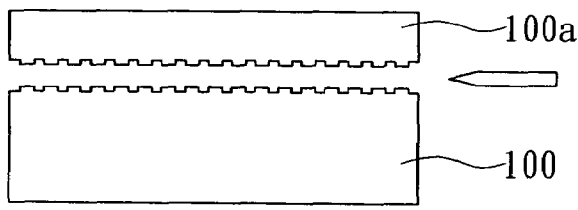
Figure 1D:
Figure 1D:
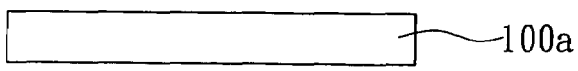
Figure 2A:
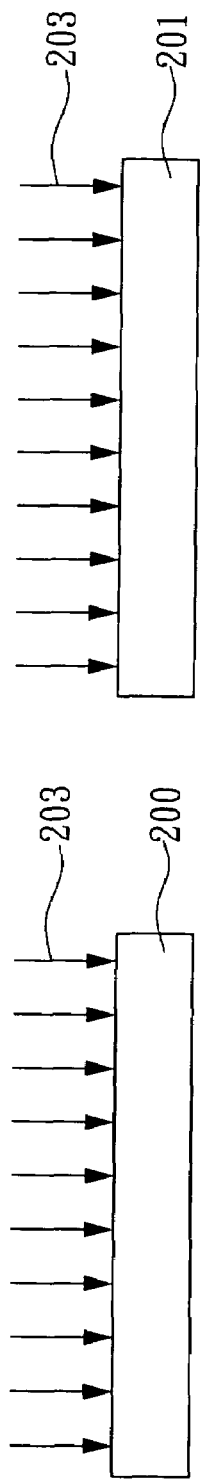
FIG. 2A to FIG. 2C is the schematic view showing the first preferred embodiment of the method for manufacturing ta bonded wafer with ultra-thin single crystal ferroelectric film according to the present invention.
Figure 2B:
Figure 2C:
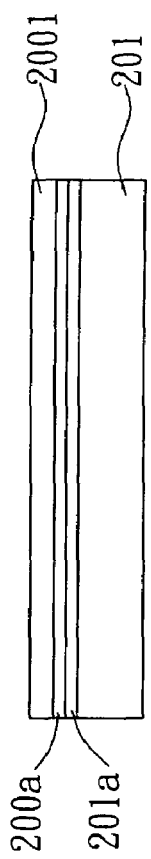

Please refer to FIG. 2A to FIG. 2C, which shows the first preferred embodiment of the method for manufacturing a bonded wafer with ultra-thin single crystal ferroelectric film according to the present invention.

As shown in the FIG. 2A, a single crystal ferroelectric wafer 200 and a carrier wafer 201 are provided. Wherein the material of the single crystal ferroelectric wafer 200 can be Lithium Niobate, Lithium Tantalate, or Barium Titanate and so on, and the material of the carrier wafer 201 can be the same as or different to that of the single crystal ferroelectric wafer 200. Then plasma 203 is used to activate the surfaces of the single crystal ferroelectric wafer 200 as well as the carrier wafer 201. It is obviously that the plasma 203 can be the low-temperature plasma, high-temperature plasma, low-pressure plasma, or normal-pressure plasma for achieving surface activation.

As shown in the FIG. 2B, the activated surface 200a of the single crystal ferroelectric wafer 200 is bonded to the activated surface 201a of the carrier wafer 201 by a heating and pressing process.

As shown in the FIG. 2C, a thinning process is performed on the single crystal ferroelectric wafer 200 for forming an ultra-thin single crystal ferroelectric film 2001, wherein the thinning process can be perform by a means of polishing, grinding, chemical mechanical polishing, or etching. During the thinning process, the bonding strength between the activated surface 200a of the single crystal ferroelectric wafer 200 and the activated surface 201a of the carrier wafer 201 is strong enough to resist the shearing force so that the bonded wafer with ultra-thin single crystal ferroelectric film 2001 of nanometer-level in thickness can be formed on the carrier wafer 201.

Figure 3A:
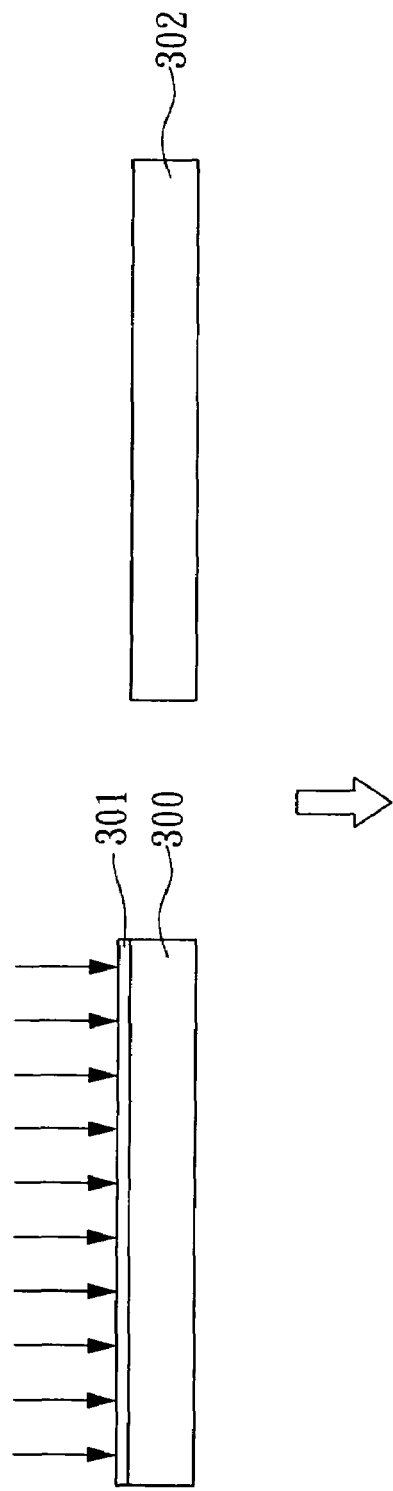
FIG. 3A to FIG. 3C is the schematic view showing the second preferred embodiment of the method for manufacturing a bonded wafer with ultra-thin single crystal ferroelectric film according to the present invention.
Figure 3B:
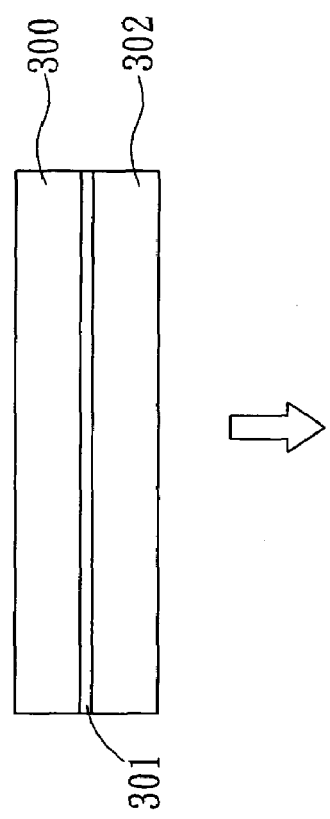
Figure 3C:

Please refer to FIG. 3A to FIG. 3C, which shows the second preferred embodiment of the method for manufacturing a bonded wafer with ultra-thin single crystal ferroelectric film according to the present invention.

As shown in the FIG. 3A, a single crystal ferroelectric wafer 300 and a carrier wafer 302 are provided, and wherein the functions and materials of the single crystal ferroelectric wafer 300 and the carrier wafer 302 are similar to those in the FIG. 2A. In the present embodiment, a poly-crystal thin film 301 is formed over the surface of the single crystal ferroelectric wafer 300 by the method of PVD (physical vapor deposition) or CVD (chemical vapor deposition) as the bonding surface for bonding to the carrier wafer 302.

As shown in the FIG. 3B and FIG. 3C, after the poly-crystal thin film 301 of the single crystal ferroelectric wafer 300 is bonded to the carrier wafer, a thinning process is being carried out on the single crystal ferroelectric wafer 300 to form an ultra-thin single crystal ferroelectric film 3001. The detail processes of the bonding method and thinning process of the second preferred embodiment are similar to those in the first preferred embodiment. And similarly, the bonding force of the poly-crystal thin film 301 is strong enough to resist the shearing force so that the bonded wafer with ultra-thin single crystal ferroelectric film 3001 of nanometer-level in thickness can be easily accomplished on the carrier wafer 302.

Figure 4A:
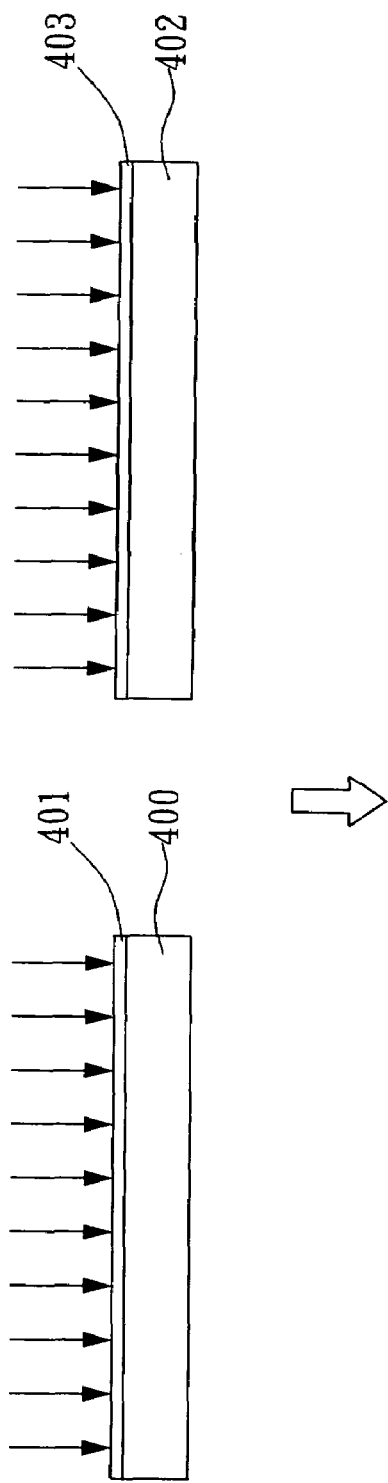
FIG. 4A to FIG. 4C is the schematic view showing the third preferred embodiment of the method for manufacturing a bonded wafer with ultra-thin single crystal ferroelectric film according to the present invention.
Figure 4B:
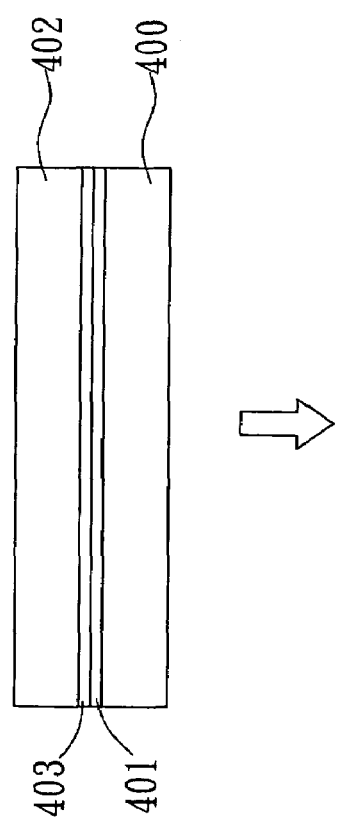
Figure 4C:
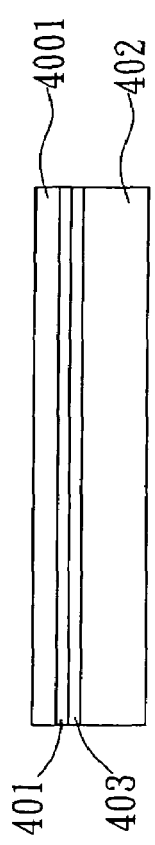

Please refer to FIG. 4A to FIG. 4C, which shows the third preferred embodiment of the method for manufacturing a bonded wafer with ultra-thin single crystal ferroelectric film according to the present invention. The present embodiment is similar to the second embodiment, and the only difference is that the third preferred embodiment has two poly-crystal thin film 401 and 403 depositing-formed on the single crystal ferroelectric wafer 400 and the carrier wafer 402 respectively. And after the bonding and thinning process, the bonded wafer with ultra-thin single crystal ferroelectric film 4001 of nanometer-level in thickness can be easily accomplished on the carrier wafer 402.

Please refer to FIG. 5A to FIG. 5G, which shows the fourth preferred embodiment of the method for manufacturing a bonded wafer with ultra-thin single crystal ferroelectric film according to the present invention.

Figure 5A:
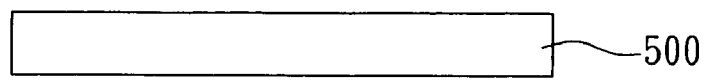
FIG. 5A to FIG. 5G is the schematic view showing the fourth preferred embodiment of the method for manufacturing a bonded wafer with ultra-thin single crystal ferroelectric film according to the present invention.
Figure 5B:
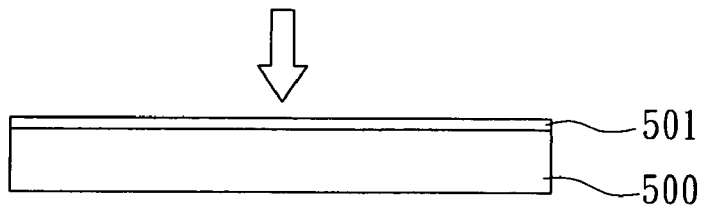

As shown in the FIG. 5A and 5B, a single crystal ferroelectric wafer 500 is provided with a bonding material 501 coating on the surface thereof. Wherein the bonding material 501 can be epoxy resin, UV photosensitive resin, or glass binding material, and so on.

Figure 5C:
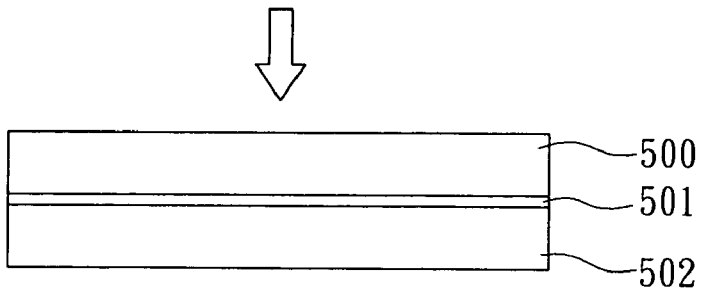

As shown in the FIG. 5C, the bonding material 501 is bonded to a first carrier wafer 502 so as to form a sandwich structure of single crystal ferroelectric wafer 500/bonding material 501/first carrier wafer 502. If UV photosensitive resin is used as the bonding material 501, the first carrier wafer 502 must be a wafer with high penetrability enabling UV light to pass through the same and irradiate on the bonding material 501.

Figure 5D:
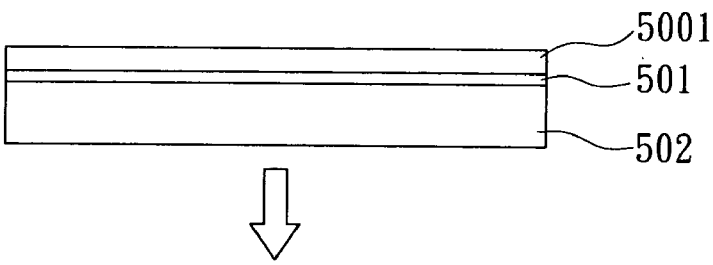

As shown in the FIG. 5D, a first thinning process is being carried out on the single crystal ferroelectric wafer 500 for forming a single crystal ferroelectric thin film 5001. However, after the first thinning process, the thickness of the single crystal ferroelectric thin film 5001 has not yet met with the required thickness.

Figure 5E:
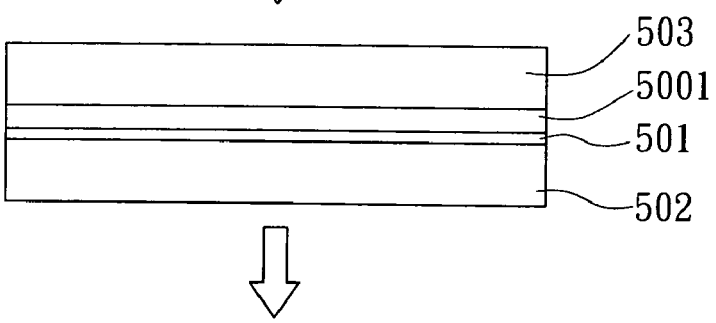
Figure 5F:
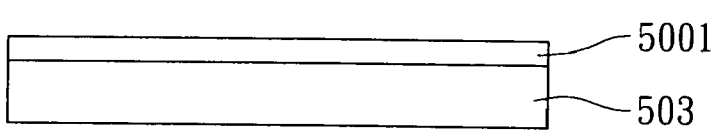

As shown in the FIG. 5E and FIG. 5F, the single crystal ferroelectric thin film 5001 is bonded to the second carrier wafer 503. Then the bonding material 501 and the first carrier wafer are removed by the method of heating, solvent removing, or etching so as to form a bonded wafer of single crystal ferroelectric thin film 5001 and second carrier wafer 503.

Figure 5G:
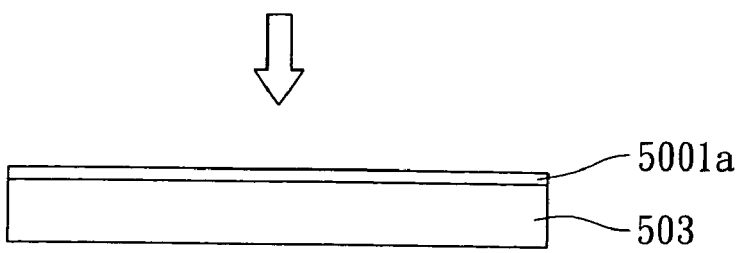

As shown in the FIG. 5G, a second thinning process is being carried out on the single crystal ferroelectric thin film 5001 so that an ultra-thin single crystal ferroelectric film 5001a of nanometer-level in thickness can be accomplished on the second carrier wafer 503.

In summary, the present invention combines the technique of wafer bonding and wafer thinning to provide a method for manufacturing a bonded wafer with ultra-thin single crystal ferroelectric film, not only reducing the cost of the equipment required, but also improving the capability of mass production. However, the aforementioned are just several preferable embodiments according to the present invention and, of course, can not used to limit the scope of the present invention, so any equivalent variation and modification made according to the claims in the present invention are all still covered by the present invention.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A method for manufacturing a bonded wafer with single crystal ferroelectric film, comprising:
    a) providing a single crystal ferroelectric wafer, a first carrier wafer, and a second carrier wafer;
    b) coating a bonding material over the surface of said single crystal ferroelectric wafer;
    c) bonding said single crystal ferroelectric wafer to said first carrier wafer with said bonding material for forming a sandwich structure as single crystal ferroelectric wafer/bonding material/first carrier wafer;
    d) thinning said single crystal ferroelectric wafer for forming a single crystal ferroelectric film;
    e) bonding said single crystal ferroelectric film to the second carrier wafer, and removing said bonding material and said first carrier wafer; and
    f) thinning said single crystal ferroelectric film for forming said single crystal ferroelectric film.

2. The method recited in claim 1, wherein said bonding material is selected from the group consisting of epoxy resin, UV photosensitive resin, and glass binding material.

3. The method recited in claim 1, wherein the material of said single crystal ferroelectric wafer is selected from the group consisting of Lithium Niobate, Lithium Tantalate, and Barium Titanate.

4. The method recited in claim 1, wherein the thinning performed in step d) is at least one process selected from the group consisting of polishing, grinding, chemical mechanical polishing, and etching.

5. The method recited in claim 1, wherein the means for removing said bonding material and said first carrier wafer in step e) is selected from the group consisting of heating, solvent removing, and etching.

6. The method recited in claim 1, wherein the thinning performed in step f) is at least one process selected from the group consisting of polishing, grinding, chemical mechanical polishing, and etching.

\* \* \* \* \*